(12) United States Patent
Kando

(10) Patent No.: US 7,310,027 B2
(45) Date of Patent: Dec. 18, 2007

(54) BOUNDARY ACOUSTIC WAVE FILTER

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/538,532

(22) Filed: Oct. 4, 2006

(65) Prior Publication Data

US 2007/0085629 A1 Apr. 19, 2007

Related U.S. Application Data

(63) Continuation of application No. PCT/JP05/06858, filed on Apr. 7, 2005.

(30) Foreign Application Priority Data

Apr. 8, 2004 (JP) ............................. 2004-114419

(51) Int. Cl.
- H03H 9/46 (2006.01)
- H03H 9/70 (2006.01)
- H03H 9/64 (2006.01)
- H03H 9/72 (2006.01)

(52) U.S. Cl. ..................... 333/133; 333/186; 333/193

(58) Field of Classification Search ............... 333/193, 333/186

See application file for complete search history.

(56) References Cited

U.S. PATENT DOCUMENTS

| 6,046,656 A | * | 4/2000 | Mishima ..................... 333/141 |
| 6,437,479 B1 | | 8/2002 | Miura et al. |
| 6,707,352 B2 | * | 3/2004 | Kawaguchi ................. 333/193 |
| 6,737,941 B1 | | 5/2004 | Tournois |
| 7,151,424 B2 | * | 12/2006 | Kando ........................ 333/193 |
| 2006/0071579 A1 | | 4/2006 | Kando |
| 2007/0001549 A1 | * | 1/2007 | Kando ........................ 310/320 |
| 2007/0007852 A1 | * | 1/2007 | Kando .................... 310/313 B |

FOREIGN PATENT DOCUMENTS

| JP | 49-98552 | 9/1974 |
| JP | 2003-017980 | 1/2003 |

(Continued)

OTHER PUBLICATIONS

Iriino, T. et al.; "Optimized Stoneley Wave Device By Proper Choice Of Glass Overcoat"; 1989 IEEE Transactions On Ultrasonics, Ferroelectrics, And Frequency Control, vol. 36, No. 2, Mar. 1989, pp. 159-167.*

(Continued)

*Primary Examiner*—Barbara Summons
(74) *Attorney, Agent, or Firm*—Keating & Bennett, LLP

(57) ABSTRACT

A boundary acoustic wave filter includes a first medium layer, a second medium layer laminated on the first medium layer, and IDT electrodes that are disposed at the boundary between the first and second medium layers and that define an electroacoustic transducer. In the boundary acoustic wave filter, the sound velocity of boundary acoustic waves, which is the product of the wavelength determined by the period of the electrodes and the frequency at least the lower end of the stopband disposed at the high-frequency side of the passband, is less than the sound velocity of slow transverse waves propagating through the first medium layer and the second medium layer.

13 Claims, 10 Drawing Sheets

FOREIGN PATENT DOCUMENTS

| | | |
|---|---|---|
| JP | 2003-512637 | 4/2003 |
| JP | 2003-283297 | 10/2003 |
| WO | 98/52279 | 11/1998 |
| WO | 2004/070946 | 8/2004 |

OTHER PUBLICATIONS

International Search Report issued in the corresponding International Application No. PCT/JP2005/006858, mailed on Aug. 9, 2005.

Yamanouchi et al., "Piezoelectric Acoustic Boundary Waves Propagating Along the Interface Between SiO2 and LiTaO3," IEEE Transactions on Sonics and Ultrasonics, Nov. 1978, pp. 384-389, vol. SU-25, No. 6, Sendai, Japan.

"Danseiha Soshi Gijutsu Handbook," Edited by Japan Society for the Promotion of Science Danseiha Soshi Gijutsu Dai 150 linkai, pp. 15-19, Nov. 30, 1991.

"Elastic Wave Device Technology Handbook"; Japan Society for the Promotion of Science, Elastic Wave Device Technology the 150th Committee; 1st Edition 1st printing; published on Nov. 30, 2001; p. 549.

* cited by examiner

BOUNDARY ACOUSTIC WAVE FILTER

BACKGROUND OF THE INVENTION

1. Field of the Invention

The present invention relates to a boundary acoustic wave filter used as, for example, a bandpass filter of communication equipment. More specifically, the present invention relates to a boundary acoustic wave filter that utilizes boundary acoustic waves propagating along the boundary between a first medium layer and a second medium layer.

2. Description of the Related Art

Various surface acoustic wave devices have been used as an RF filter and an IF filter for cell phones, a resonator for VCOs, a VIF filter for televisions, and other suitable devices. The surface acoustic wave devices utilize surface acoustic waves such as Rayleigh waves or first leaky waves that propagate on the surface of a medium.

Since surface acoustic waves propagate on the surface of a medium, they are sensitive to changes in the surface condition of the medium. Accordingly, in order to protect the surface of the medium on which surface acoustic waves propagate, a surface acoustic wave element is hermetically sealed in a package including a cavity facing the propagating surface. The use of such a package including a cavity inevitably increases the cost of the surface acoustic wave device. Furthermore, since the dimensions of the package are significantly larger than the dimensions of the surface acoustic wave element, the size of the surface acoustic wave device is inevitably increased.

On the other hand, elastic waves include not only the above surface acoustic waves, but also boundary acoustic waves that propagate along the boundary between solids.

For example, "Piezoelectric Acoustic Boundary Waves Propagating Along the Interface Between $SiO_2$ and $LiTaO_3$," IEEE Trans. Sonics and Ultrason., VOL. SU-25, No. 6, 1978 IEEE (Non-Patent Document 1) discloses a boundary acoustic wave device in which IDTs are provided on a 126° rotation Y-plate X-propagation $LiTaO_3$ substrate, and a $SiO_2$ film having a predetermined thickness is provided on the IDTs and the $LiTaO_3$ substrate. According to the device, (SV+P)-type boundary acoustic waves, which are referred to as Stoneley waves, propagate. In the description of Non-Patent Document 1, when the thickness of the $SiO_2$ film is about 1.0λ (wherein λ represents the wavelength of the boundary acoustic waves), the electromechanical coefficient is about 2%.

Boundary acoustic waves propagate in a state in which energy is concentrated at a boundary portion between solids. Accordingly, since energy is negligible on the bottom surface of the $LiTaO_3$ substrate and the top surface of the $SiO_2$ film, the characteristics are not changed by changes in the surface condition of the substrate or the thin film. Consequently, a package including a cavity is not necessary, and thus, the size of the elastic wave device is reduced.

It is known that bulk waves propagating through a medium layer include three types of wave, i.e., longitudinal waves, fast transverse waves, and slow transverse waves. These three types of wave are referred to as P waves, SH waves, and SV waves. The waves of the SH waves and the SV waves that become the slow transverse waves depends on the anisotropy of the material. When the material is isotropic, two types of waves, i.e., longitudinal waves and transverse waves are generated.

Among the above-described three types of bulk wave, the slow transverse waves have the lowest sound velocity.

On the other hand, boundary acoustic waves that propagate through an anisotropic material, such as a piezoelectric substrate, propagate with a combination of three partial wave components, i.e., the P waves, the SH waves, and the SV waves. The types of boundary acoustic wave are classified in accordance with a main component. For example, boundary acoustic waves known as Stoneley waves are boundary acoustic waves primarily composed of the P wave component and the SV wave component, and SH-type boundary waves are boundary acoustic waves primarily composed of the SH wave component. Under some conditions, boundary acoustic waves propagate without a combination of the above components.

Boundary acoustic waves normally propagate with a combination of the above three partial wave components. Therefore, for example, in boundary acoustic waves whose sound velocity is higher than that of the SH waves, the SH wave component and the SV wave component leak. In boundary acoustic waves whose sound velocity is higher than that of the SV waves, the SV wave component leaks. These leaked components cause propagation loss of the boundary acoustic waves. Accordingly, it is believed that, in boundary acoustic waves that propagate along the boundary between two medium layers, the sound velocity of the boundary acoustic waves is less than the sound velocity of the slow transverse waves of the two medium layers, thereby concentrating the energy of the boundary acoustic waves near electrodes disposed between the two medium layers to obtain a condition in which the propagation loss is zero.

In radio equipment used in a frequency band such as the 800 MHz band, the 900 MHz band, or the 1,900 MHz band, which is represented by cell phones, transmission and reception are performed at the same time in a transmission band and a reception band that have different frequencies. In such radio equipment, a transmission filter in which the transmission band is the passband and the reception band is the stopband, and a reception filter in which the reception band is the passband and the transmission band is the stopband are used.

Each of the transmission filter and the reception filter may be provided as a single chip component. Alternatively, the transmission filter and the reception filter may be combined to define an antenna duplexer, i.e., duplexer.

Where a boundary acoustic wave device is used as the transmission filter and the reception filter, as described above, even when a boundary acoustic wave filter is prepared under conditions in which the propagation loss is sufficiently reduced, it is difficult to achieve a satisfactory frequency characteristic. Specifically, the present inventors have confirmed the following phenomenon through experiments. Even if the loss is reduced by eliminating a leakage component only in the passband to reduce the propagation loss, when a leakage component is present in the attenuation band disposed at the high-frequency side of the passband, the electric power of the attenuation band is directly transmitted by the leakage component from the input port to the output port, resulting in an insufficient attenuation. Consequently, it is difficult to achieve a satisfactory frequency characteristic. Accordingly, when a boundary acoustic wave filter is used as the transmission filter and the reception filter, particularly in the transmission filter, the attenuation in the stopband disposed at the high-frequency side of the passband, that is, in the passband of the reception filter is not satisfactory.

SUMMARY OF THE INVENTION

To overcome the problems described above, preferred embodiments of the present invention provide a boundary acoustic wave filter having a reduced size, wherein when the filter defines a transmission filter or a reception filter of radio equipment, a satisfactorily large attenuation is provided in the stopband, and the filter has a satisfactory frequency characteristic.

A boundary acoustic wave filter according to a preferred embodiment of the present invention includes a first medium layer, a second medium layer laminated on the first medium layer, and electrodes that are disposed at the boundary between the first medium layer and the second medium layer and define an electroacoustic transducer, wherein the product of the wavelength λ determined by the period of the electrodes and the frequency at least the lower end of the stopband disposed at the high-frequency side of the passband is less than the sound velocity of slow transverse waves propagating through at least one of the first medium layer and the second medium layer.

In the boundary acoustic wave filter according to preferred embodiments of the present invention, the first medium layer or the second medium layer is preferably isotropic, and when the sound velocity of slow transverse waves propagating through at least one of the first medium layer and the second medium layer is represented by Vs, the elastic stiffness constants of the first medium layer and the second medium layer are represented by C11 and C12, respectively, and the density is represented by ρ, the sound velocity Vs satisfies expression (1):

Expression 1

$$V_S = \sqrt{\frac{C_{11} - C_{12}}{2\rho}} \qquad (1)$$

In the boundary acoustic wave filter according to preferred embodiments of the present invention, preferably, a sound-absorption medium layer is provided on the outer surface of at least one of the first medium layer and the second medium layer.

Preferably, irregularities are provided on the outer surface of at least one of the first medium layer and the second medium layer.

Preferably, the electrodes are composed of at least one metal selected from the group consisting of Au, Ag, Cu, Fe, Ta, W, Ti, and Pt.

In the boundary acoustic wave filter according to preferred embodiments of the present invention, each of the medium layers are preferably composed of various types of material. For example, each of the medium layers is composed of one substance selected from the group consisting of lithium niobate, potassium niobate, lithium tantalate, lithium tetraborate, langasite, langanite, quartz crystal, PZT, ZnO, AlN, silicon oxides, glass, silicon, sapphire, silicon nitride, and carbon nitride.

Preferably, at least one of the first medium layer and the second medium layer has a laminated structure in which a plurality of material layers are laminated.

In the boundary acoustic wave filter according to another preferred embodiment, the boundary acoustic wave filter is preferably used in a communication device including a transmission filter and a reception filter. In particular, the boundary acoustic wave filter is used as one of the filters having a relatively low frequency.

In the boundary acoustic wave filter according to another preferred embodiment of the present invention, the boundary acoustic wave filter is preferably used as a transmission filter or a reception filter of a duplexer including the transmission filter and the reception filter, the boundary acoustic wave filter has a relatively low frequency.

In the boundary acoustic wave filter according to another preferred embodiment of the present invention, the boundary acoustic wave filter is preferably used as a transmission filter or a reception filter of a communication device or a duplexer including the transmission filter and the reception filter and is used as one of the filters in which the center frequency is relatively low. In addition, in the filter in which the center frequency is relatively low, the product of the wavelength λ determined by the period of the electrodes and the frequency at the higher end of the passband of another filter in which the center frequency is relatively high in the stopband at the high-frequency side of the passband of the filter in which the center frequency is relatively low, is smaller than the sound velocity of the slow transverse waves.

The product of the wavelength λ determined by the period of the electrodes and the frequency in the stopband disposed at the high-frequency side of the passband is preferably less than the sound velocity of slow transverse waves propagating through the first medium layer or the second medium layer. Therefore, the energy of the boundary acoustic waves is concentrated near the electrodes disposed at the boundary between the first medium layer and the second medium layer. Consequently, boundary acoustic waves having a small leakage component are utilized. Thereby, a decrease in the attenuation due to the leakage component in the stopband at the high-frequency side is suppressed to provide a sufficient attenuation. Accordingly, a boundary acoustic wave filter having a satisfactory frequency characteristic is provided. In particular, for example, in an antenna duplexer including a filter having a passband of the low-frequency side and a filter having a passband of the high-frequency side, a boundary acoustic wave filter suitable for the filter having a passband of the low-frequency side is provided.

When the first medium layer or the second medium layer is isotropic, the sound velocity Vs of slow transverse waves propagating through the first medium layer or the second medium layer is represented by expression (1). The sound velocity of the slow transverse waves propagating through the medium layer can be calculated using the expression.

When a sound-absorption medium layer is further provided on the outer surface of at least one of the first medium layer and the second medium layer, the higher-order spurious mode is suppressed and the degradation due to leaky bulk waves is suppressed. Consequently, a more satisfactory frequency characteristic is achieved.

When irregularities are provided on the outer surface of at least one of the first medium layer and the second medium layer, the degradation due to leaky bulk waves is suppressed, thereby achieving a more satisfactory frequency characteristic.

In preferred embodiments of the present invention, when the electrodes are composed of at least one metal selected from the group consisting of Au, Ag, Cu, Fe, Ta, W, Ti, and Pt, a structure is provided in which boundary waves are propagated by, for example, using the structure described in Japanese Patent Application No. 2003-32409, which provides priority for WO 2004/070946, which has the U.S. equivalent of U.S. Patent Application Publication No. 2006/

0071579, which is an application made by the present inventors and has not yet been disclosed. Specifically, the film thickness of electrodes provided between the first medium layer and the second medium layer, the duty ratio of the electrodes, or the density of the electrodes is controlled to be within a predetermined range. Thereby, the sound velocity of boundary acoustic waves is controlled to be less than the sound velocity of slow transverse waves propagating through the first medium layer and the second medium layer. Thus, the structure in which boundary waves are propagated is provided.

When each of the first medium layer and the second medium layer is composed of one substance selected from the group consisting of lithium niobate, potassium niobate, lithium tantalate, lithium tetraborate, langasite, langanite, quartz crystal, PZT, ZnO, AlN, silicon oxides, glass, silicon, sapphire, silicon nitride, and carbon nitride, a structure is provided in which boundary waves are propagated by, for example, using the structure described in Japanese Patent Application No. 2003-32409, which is an application made by the present inventors and has not yet been disclosed. Specifically, the film thickness of electrodes provided between the first medium layer and the second medium layer that are composed of a substance selected from the above compositions, the duty ratio of the electrodes, or the density of the electrodes is controlled to be within a predetermined range. Thereby, the sound velocity of boundary acoustic waves is controlled to be less than the sound velocity of slow transverse waves propagating through the first medium layer and the second medium layer. Thus, the structure in which boundary waves are propagated is provided.

When at least one of the first medium layer and the second medium layer has a laminated structure in which a plurality of material layers are laminated, the sound velocity of the medium layer having the laminated structure is controlled by appropriately selecting the plurality of material layers.

When the boundary acoustic wave filter of preferred embodiments of the present invention is used as a boundary acoustic wave filter used in a communication device including a transmission filter and a reception filter, the filter having a relatively low frequency, according to preferred embodiments of the present invention, a sufficient attenuation is provided in the stopband disposed at the high-frequency side of the passband.

When the boundary acoustic wave filter of preferred embodiments of the present invention is used as a transmission filter or a reception filter of a duplexer including the transmission filter and the reception filter, the filter having a relatively low frequency, a sufficient attenuation is provided in the stopband disposed at the side of frequency higher than the passband, that is, in the stopband, which is the passband of the counterpart filter.

In the above communication device or the duplexer, when the boundary acoustic wave filter according to preferred embodiments of the present invention is used as the filter in which the center frequency is relatively low, preferably, in the stopband at the high-frequency side of the passband of the filter in which the center frequency is relatively low, when the product of the wavelength $\lambda$ determined by the period of the electrodes and the frequency at the higher end of the passband of a counterpart filter, in which the center frequency is relatively high, is less than the sound velocity of the slow transverse waves, the following advantage is provided. That is, in the filter characteristic of the filter in which the center frequency is relatively low, a sufficient attenuation is ensured in the high-frequency side of the passband, i.e., in the frequency range extending to the higher end of the passband of the counterpart filter in which the center frequency is relatively high. Accordingly, a duplexer and a communication device in which the attenuation in the stopband is ensured over a sufficient frequency range are provided.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of a boundary acoustic wave filter of the present invention will now be described with reference to the drawings.

Figure 15:
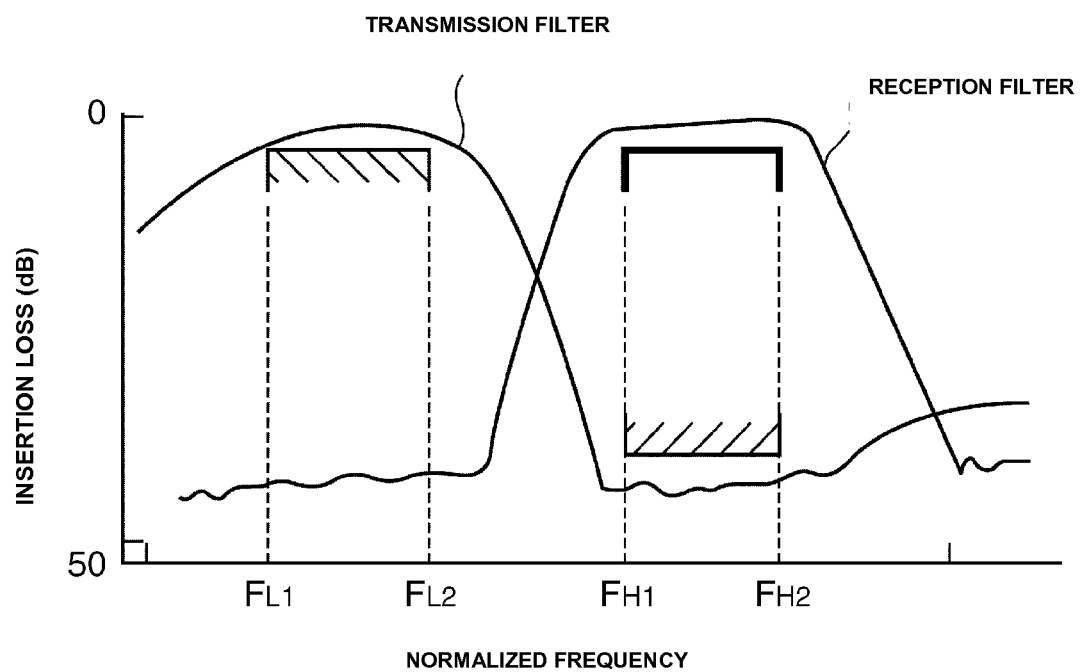
FIG. 15 is a graph showing an example of frequency characteristics of a transmission filter and a reception filter.

When the sound velocity of boundary acoustic waves is controlled to be less than the sound velocity of slow transverse waves propagating through a first medium layer and a second medium layer, the energy of the boundary acoustic waves is concentrated near electrodes disposed in the boundary, thus obtaining a condition in which the propagation loss is zero. Consequently, a transmission filter and a reception filter, whose target frequency characteristics are shown in FIG. 15, were prepared using boundary acoustic wave filters. In FIG. 15, the range represented by frequencies FL1 to FL2 is the transmission side passband, and the range represented by frequencies FH1 to FH2 is the reception side passband, wherein FH1>FL2.

The normalized frequency of FL1 was about 0.91, the normalized frequency of FL2 was about 0.97, the normalized frequency of FH1 was about 1.03, and the normalized frequency of FH2 was about 1.09. In this normalized frequency, the center frequency of a band disposed between the transmission side passband and the reception side passband is defined as 1.0.

The transmission filter was designed as follows. The band in the range of frequencies FL1 to FL2 was the passband, and the maximum insertion loss in the passband was about 5 dB or less. The band in the range of frequencies FH1 to FH2 was the stopband, and the minimum relative attenuation in the stopband was about 20 dB.

The reception filter was designed so that the band in the range of FH1 to FH2 was the passband, and the maximum insertion loss in the passband was about 5 dB or less.

Figure 16A:
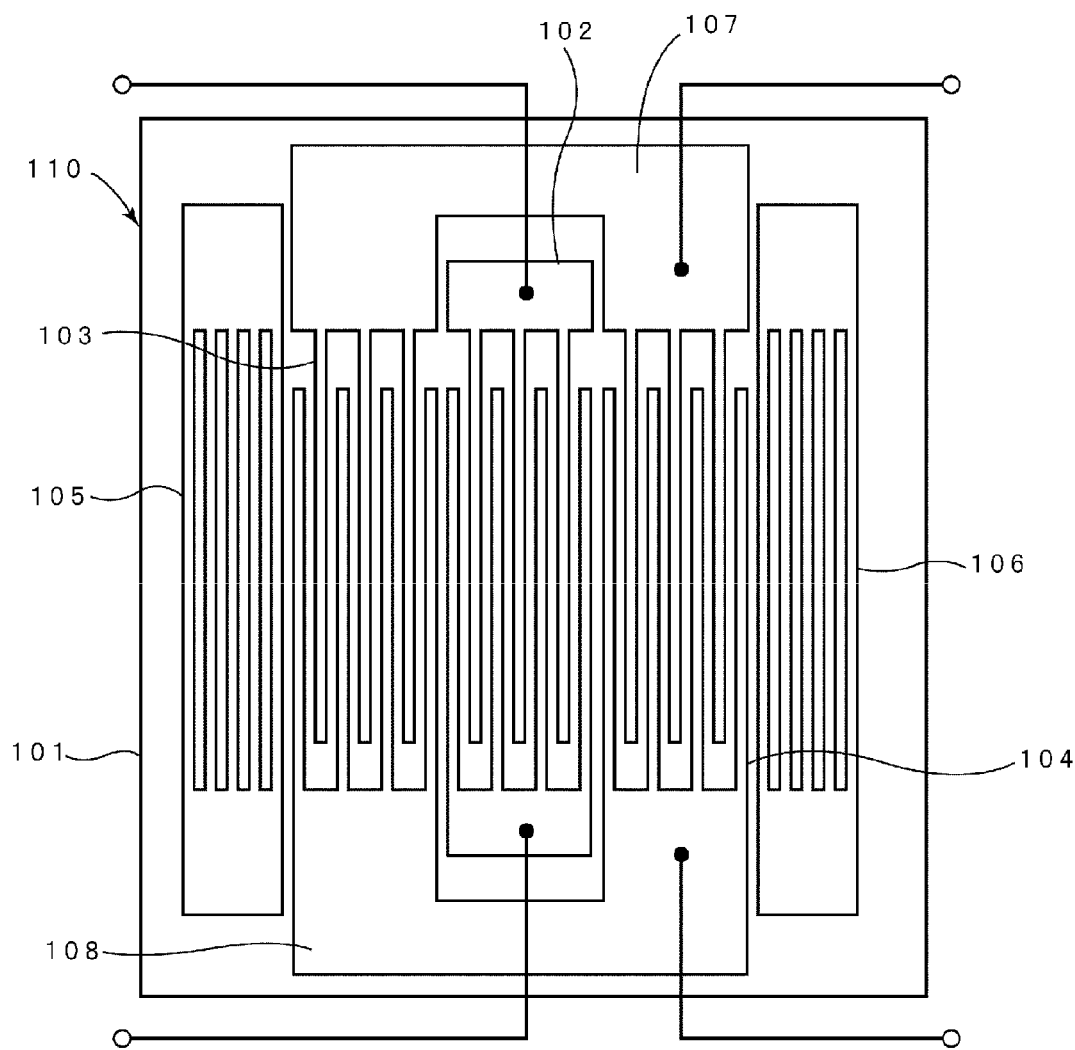
FIG. 16A is a plan view showing an electrode structure of a boundary acoustic wave filter that has become a premise for making the present invention and a boundary acoustic wave filter according to a preferred embodiment of the present invention.

As shown by the plan view of FIG. 16A, IDT electrodes 102 to 104, reflectors 105 and 106, and wiring electrodes 107 and 108 were formed on a 15° Y-cut X-propagation LiNbO$_3$ substrate 101. These electrodes were formed by vapor deposition. Specifically, a NiCr film was formed as a base electrode layer by vapor deposition, and an Au film was then formed as a main electrode layer by vapor deposition. As shown in FIG. 16A, output IDT electrodes 103 and 104 are disposed at either side of an input IDT electrode 102. The output IDT electrodes 103 and 104 are connected in common by the wiring electrode 108. Furthermore, the reflectors 105 and 106 are disposed on the outside of the output IDT electrodes 103 and 104 in the boundary-wave-propagating direction, respectively. That is, this electrode structure is an electrode structure which defines a longitudinally coupled boundary acoustic wave resonator with a 3-IDT structure.

Figure 16B:
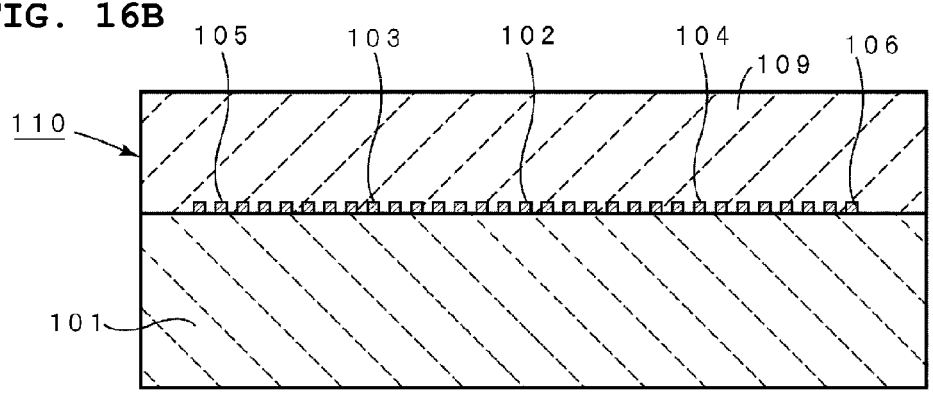
FIG. 16B is a schematic front cross-sectional view of the boundary acoustic wave filters.

Subsequently, a SiO$_2$ film was deposited by RF magnetron sputtering so as to cover the IDT electrodes 102 to 104 and the reflectors 105 and 106, thereby preparing a boundary acoustic wave filter 110 shown in FIG. 16B. In the boundary acoustic wave filter 110, the IDT electrodes 102 to 104 and the reflectors 105 and 106 are disposed between the LiNbO$_3$ substrate 101 defining a first medium layer and the SiO$_2$ film 109 defining a second medium layer.

In the boundary acoustic wave filter 110 having the above structure, the electrodes were designed as described below to prepare the transmission filter and the reception filter.

The $\lambda$ determined by the electrode period in the transmission filter was about 3.0 μm according to the arrangement period of the central portion of the input IDT electrode 102. The wavelength $\lambda$ determined by the electrode period in the reception filter was about 0.9 times that of the transmission filter. In both the transmission filter and the reception filter, the electrode finger crossing width was about 50$\lambda$, the number of pairs of the electrode fingers of the input IDT was 14.5, the arrangement period of four electrode fingers at the ends of the IDT was about 0.86$\lambda$, the number of pairs of the electrode fingers of the output IDT electrodes 103 and 104 was 8.5, and the arrangement period of four electrode fingers adjacent to the side of the input IDT electrode 102 was about 0.86$\lambda$. In each of the reflectors 105 and 106, the number of electrode fingers was 41, and the arrangement period of the electrode fingers was about 1.033$\lambda$. The passband of the transmission filter or the reception filter was disposed within the reflection band of the reflectors.

The distance between the centers of adjacent electrode fingers in the input IDT electrode 102 and each of the output IDT electrodes 103 and 104 was about 0.43$\lambda$. The distance between the centers of adjacent electrode fingers in the output IDT electrodes 103 and 104 and the reflectors 105 and 106, respectively, was about 0.5$\lambda$. The duty ratio of the IDT electrodes 102 to 104 and the reflectors 105 and 106 was about 0.5. For the purpose of this description, the duty ratio is defined as a value represented by L/P where L represents the width of the electrode finger along the boundary-wave-propagating direction and P represents the distance between the centers of spaces that are disposed between each electrode finger, i.e., disposed at either side of each electrode finger. The arrangement period $\lambda$ of the IDT electrodes and the reflectors is $\lambda=2\times P$.

In the formation of the IDT electrodes 102 to 104 and reflectors 105 and 106, the thickness of the Au film was about 0.04$\lambda$, and that of the NiCr film, which is a base film of the Au film, was about 0.003$\lambda$.

Figure 17:
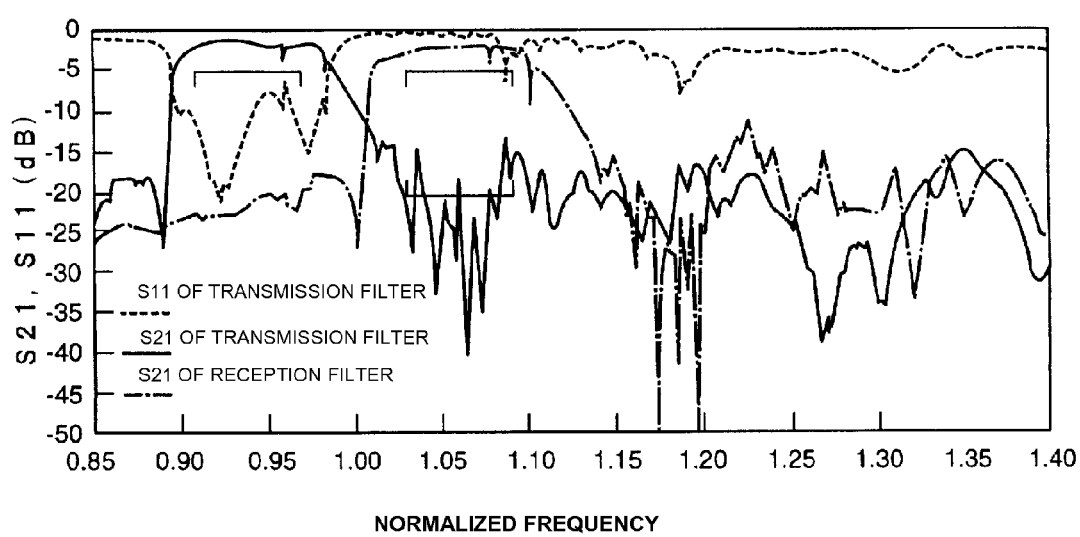
FIG. 17 is a graph showing frequency characteristics of the boundary acoustic wave filter according to a preferred embodiment of the present invention.

FIG. 17 shows the S21 characteristic (transmission characteristic) and the S11 characteristic (reflection characteristic) of the transmission filter and the reception filter prepared as described above.

As shown in FIG. 17, in both the transmission filter and the reception filter, the attenuation in the stopband disposed at the high-frequency side of the passband is not sufficient. When, for example, a branching filter including a transmission filter and a reception filter is prepared, in the transmission filter in which the passband is relatively low, the attenuation in the stopband at the high-frequency side must be sufficiently ensured. Otherwise, the attenuation in the passband of the reception filter, which is a counterpart filter, is not sufficient, and thus, the target characteristic cannot be achieved. As shown in FIG. 17, in the range of FH1 to FH2, which is the stopband of the transmission filter, the attenuation of the transmission filter is no more than about 15 dB. This result shows that the target characteristic cannot be achieved.

As described above, in a boundary acoustic wave filter, it has been difficult to ensure a sufficient attenuation in the stopband disposed at the high-frequency side of the passband.

In contrast, according to preferred embodiments of the present invention, a sufficient attenuation in the stopband disposed at the high-frequency side of the passband is achieved. This will be clarified by describing an example of preferred embodiments of the present invention.

Figure 2A:
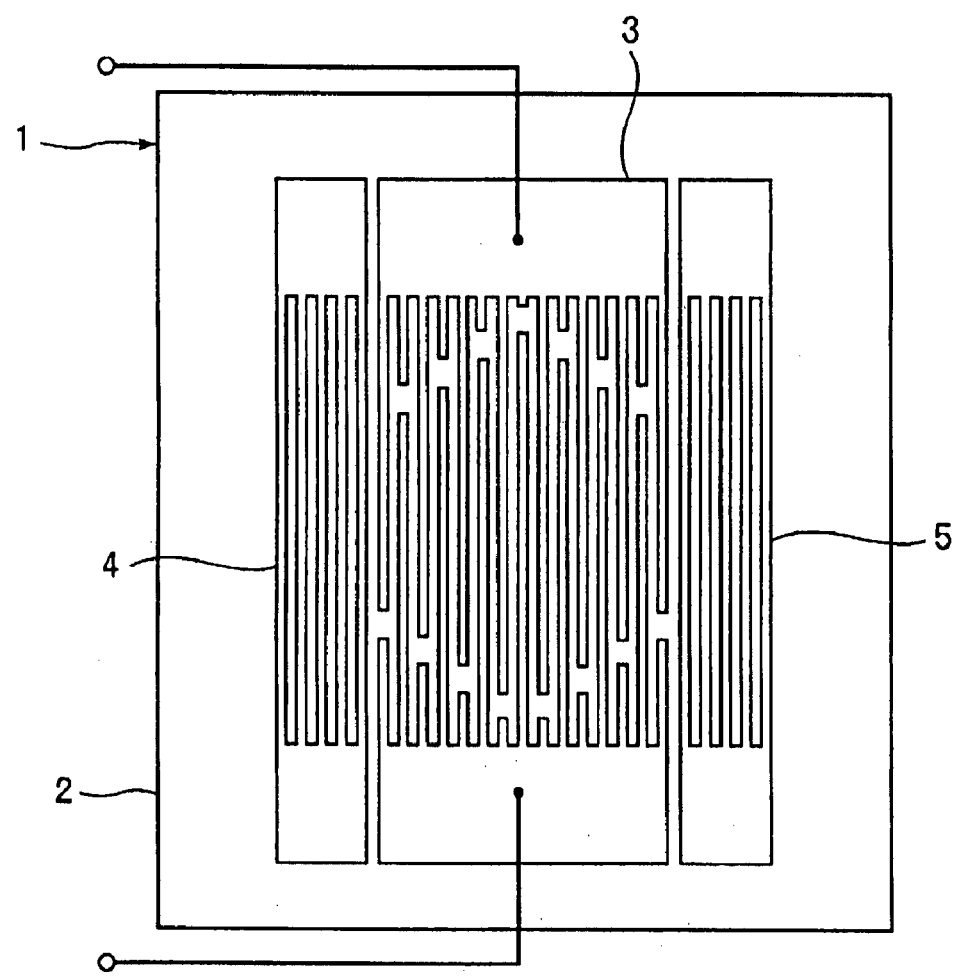
FIG. 2A is a plan view showing an electrode structure of a 1-port boundary acoustic wave resonator according to a preferred embodiment of the present invention.
Figure 2B:
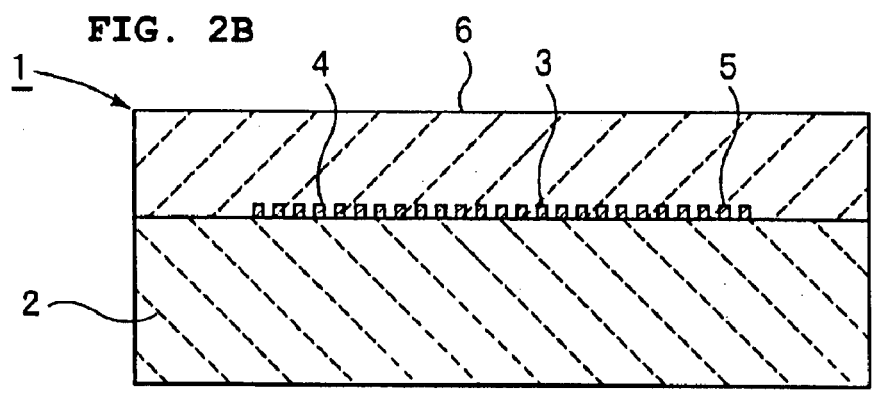
FIG. 2B is a front cross-sectional view thereof.

In order to confirm the relationship between boundary acoustic waves and the sound velocity of slow transverse waves that propagate through a medium layer, the present inventors prepared a 1-port boundary acoustic wave resonator shown in FIGS. 2A and 2B and conducted experiments thereon.

FIG. 2A is a plan view showing an electrode structure of the 1-port boundary acoustic wave resonator, and FIG. 2B is a front cross-sectional view of the boundary acoustic wave resonator. In this example, a 1-port boundary acoustic wave resonator 1 includes a 15° rotation Y-plate X-propagation $LiNbO_3$ substrate 2 defining a first medium layer. An IDT electrode 3 and reflectors 4 and 5 were formed on the $LiNbO_3$ substrate 2. The IDT electrode 3 and the reflectors 4 and 5 have a structure in which a Au film having a thickness of about 0.04λ, about 0.05λ, or about 0.06λ is laminated on a NiCr film having a thickness of about 0.003λ.

In the IDT electrode 3, the number of pairs of the electrode fingers was 50.5, and the arrangement periods of the electrode fingers was about 3.0 μm. In the reflectors 4 and 5, the number of electrode fingers was 51, and the arrangement period of the electrode fingers was λ. The electrode finger crossing width in the IDT electrode was about 50λ.

The distance between the centers of adjacent electrode fingers in the IDT electrode 3 and the reflectors 4 and 5 was about 0.5λ. The duty ratio in the IDT electrode 3 and the reflectors 4 and 5 was about 0.5.

After the IDT electrode 3 and the reflectors 4 and 5 were formed, a $SiO_2$ film was deposited so as to have a thickness of about 2λ.

As described above, a boundary acoustic wave device 1 having a $SiO_2$ film 6 defining a second medium layer was prepared. In this case, three types of boundary acoustic wave resonator having an Au film thickness of about 0.04λ, about 0.05λ, and about 0.06λ were prepared.

Figure 3:
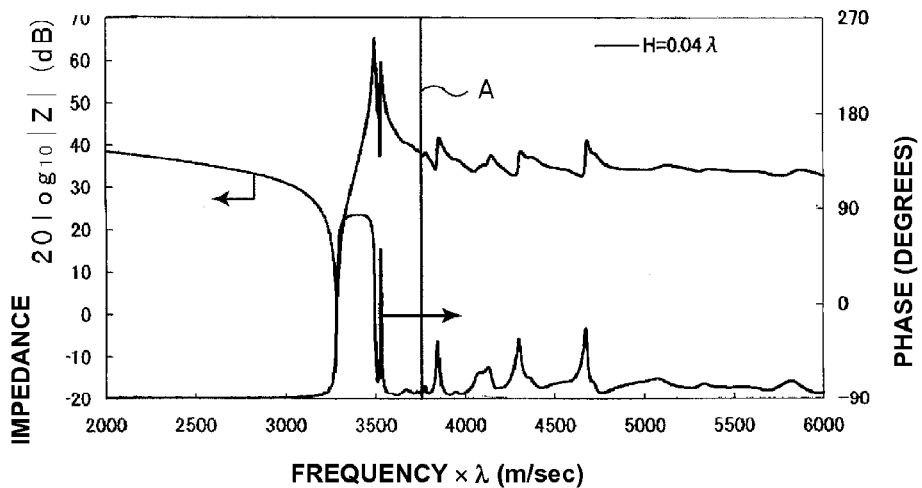
FIG. 3 is a graph showing an impedance characteristic and a phase characteristic in the case where a Au film in the 1-port boundary acoustic wave resonator has a thickness of about $0.04\lambda$.
Figure 4:
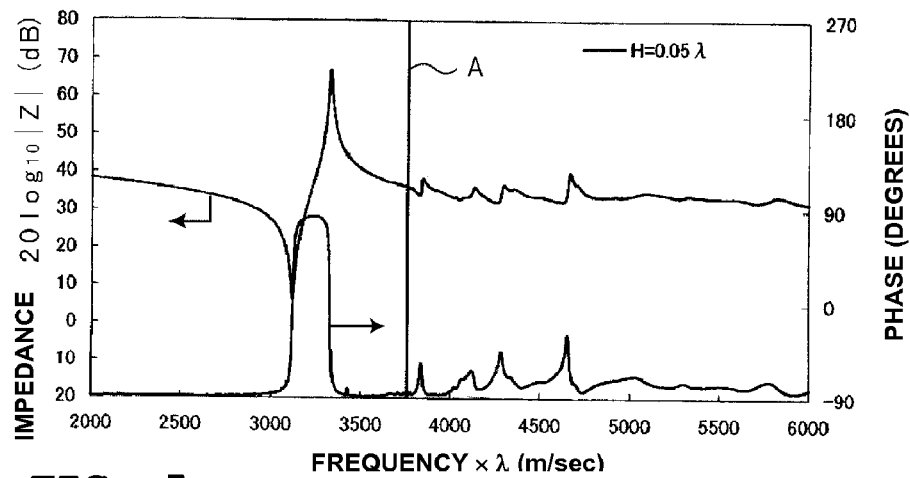
FIG. 4 is a graph showing an impedance characteristic and a phase characteristic in the case where a Au film in the 1-port boundary acoustic wave resonator has a thickness of about $0.05\lambda$.
Figure 5:
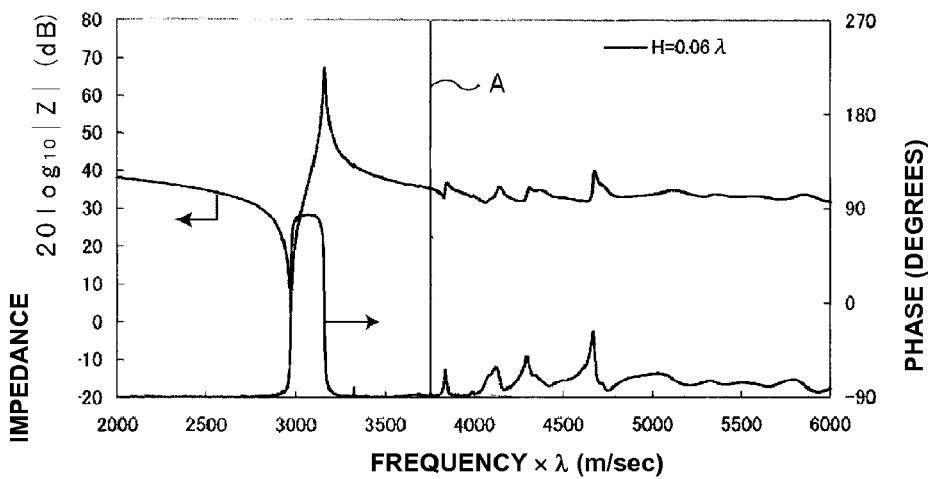
FIG. 5 is a graph showing an impedance characteristic and a phase characteristic in the case where a Au film in the 1-port boundary acoustic wave resonator has a thickness of about $0.06\lambda$.

FIGS. 3 to 5 show an impedance characteristic and a phase characteristic of the boundary acoustic wave resonators having a Au film thickness of about 0.04λ, about 0.05λ, and about 0.06λ. In FIGS. 3 to 5, each continuous line A extending in the ordinate direction shows the position of a sound velocity of slow transverse waves propagating through $SiO_2$.

The sound velocities of longitudinal waves, fast transverse waves, and slow transverse waves in the 15° rotation Y-plate X-propagation $LiNbO_3$ were about 6,547 m/sec, about 4,752 m/sec, and about 4,031 m/sec, respectively. The sound velocities of longitudinal waves and slow transverse waves propagating through $SiO_2$ were about 5,960 m/sec and about 3,757 m/sec, respectively.

FIGS. 3 to 5 show that responses due to the higher-order spurious component are generated at the frequency side higher than the sound velocity of slow transverse waves propagating through $SiO_2$. These figures also show that the phase characteristic is greater than −90 degrees at areas other than the bands where the higher-order spurious component is generated.

A spurious response is generated near the anti-resonant frequency in the impedance characteristic. This is a spurious response caused by boundary acoustic waves whose mode is different from that of the main response, and can be suppressed by adjusting the Euler angles of the $LiNbO_3$ substrate by about ±5 degrees.

Figure 6:
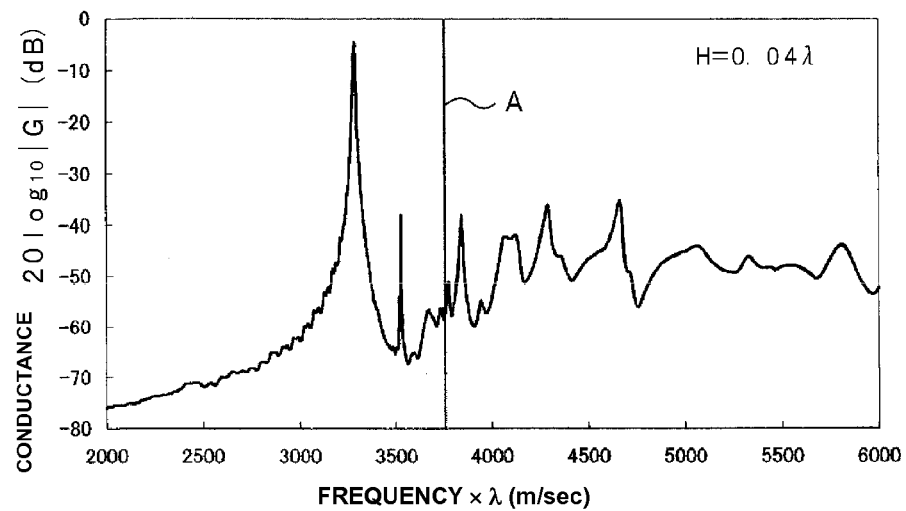
FIG. 6 is a graph showing an input conductance characteristic in the case where a Au film in the 1-port boundary acoustic wave resonator has a thickness of about $0.04\lambda$.
Figure 7:
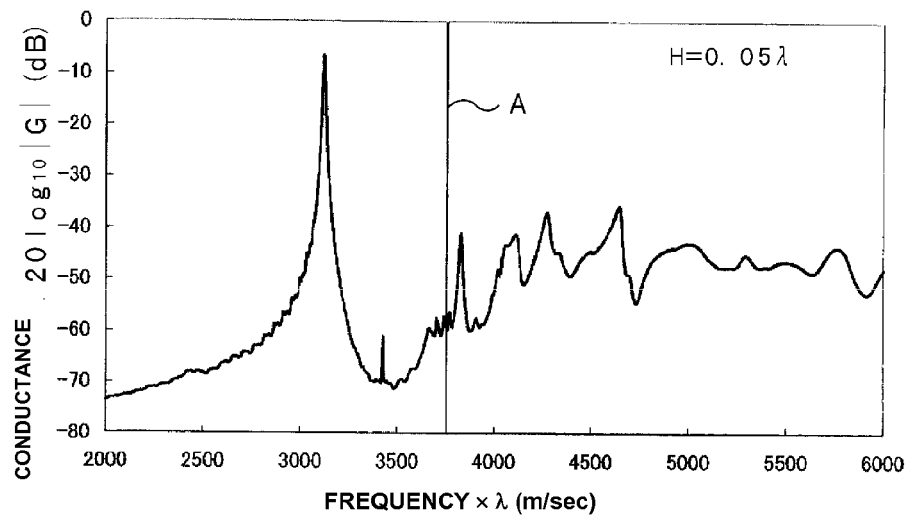
FIG. 7 is a graph showing an input conductance characteristic in the case where the Au film in the 1-port boundary acoustic wave resonator has a thickness of about $0.05\lambda$.
Figure 8:
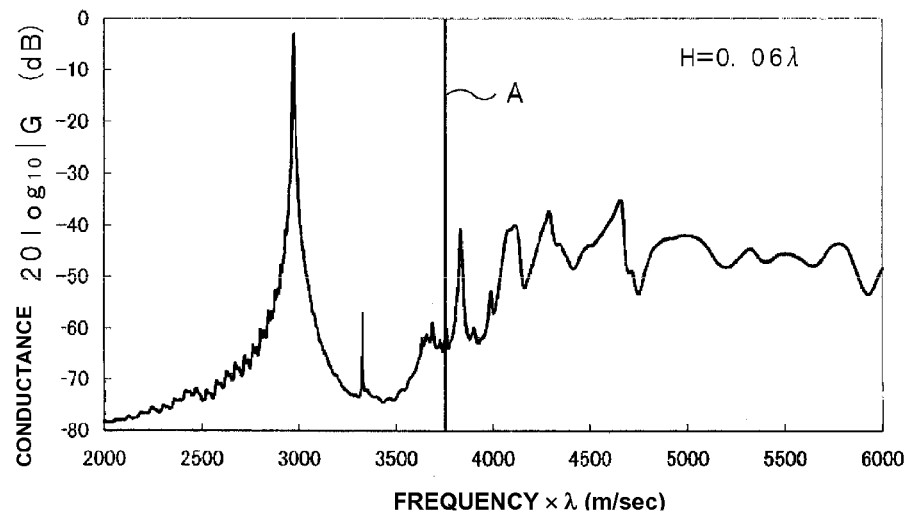
FIG. 8 is a graph showing an input conductance characteristic in the case where the Au film in the 1-port boundary acoustic wave resonator has a thickness of about $0.06\lambda$.

FIGS. 6 to 8 are graphs showing the input conductance characteristic of the 1-port boundary acoustic wave resonator 1. Preferably, the input conductance is large only near the resonant frequency of the main response and small in the other bands. However, these figures show that the conductance is large at the frequency side higher than the sound velocity of slow transverse waves propagating through the $SiO_2$ film in bands where responses caused by the boundary acoustic waves or the higher-order spurious mode are not present. This is caused by radiation damping due to leaky bulk waves.

Referring to FIGS. 3 to 8, the higher-order spurious mode or the degradation of the conductance due to the leaky bulk waves is generated at the frequency side higher than the sound velocity of slow transverse waves propagating through the $SiO_2$ film.

The results also show that the conductance is further degraded at the frequency side higher than the sound velocity of slow transverse waves propagating through $LiNbO_3$. For example, in the boundary acoustic wave device having a Au film thickness of about 0.06λ, as shown in FIG. 8, the conductance is about −63 dB near a sound velocity of about 3,757 m/sec, and the conductance is increased to about −50 dB near about 4,031 m/sec. This is because a leak due to leaky bulk waves occurs not only on the $SiO_2$ film side but also on the $LiNbO_3$ substrate side.

Figure 1A:
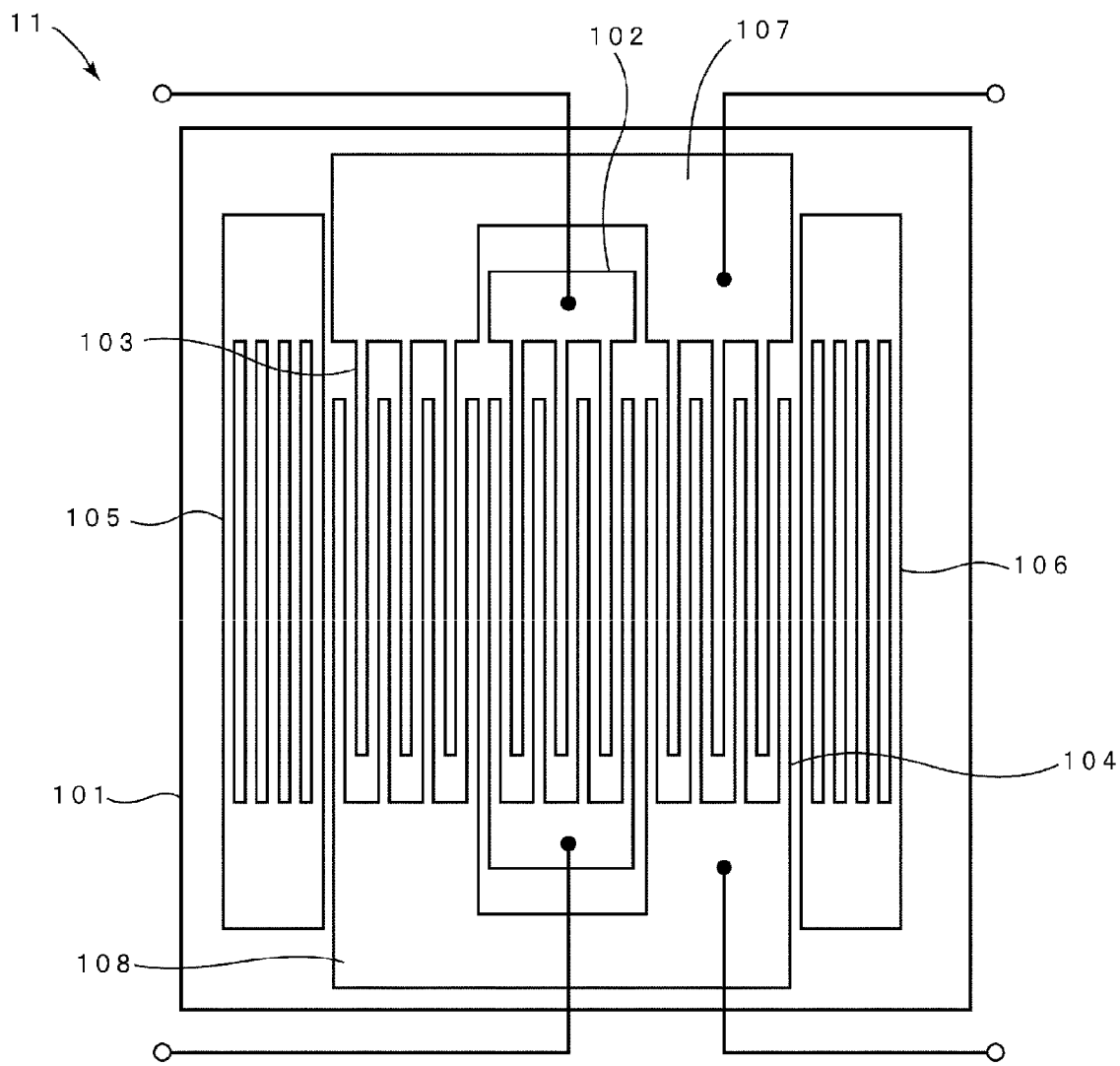
FIG. 1A is a plan view showing an electrode structure of a boundary acoustic wave filter of a preferred embodiment of the present invention.
Figure 1B:
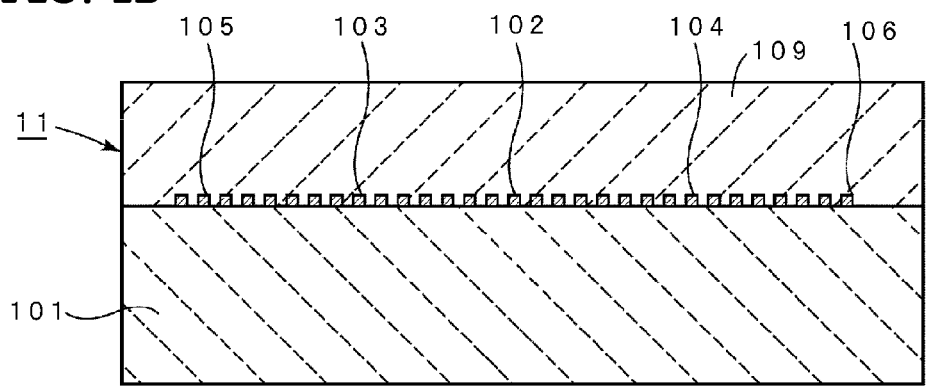
FIG. 1B is a front cross-sectional view of the boundary acoustic wave filter.

In view of the above results, a boundary acoustic wave filter 11 shown in FIGS. 1A and 1B according to a preferred embodiment of the present invention was prepared. FIG. 1A is a plan view showing the structure of the boundary acoustic wave filter of the present preferred embodiment, and FIG. 1B is a front cross-sectional view thereof. The electrode structure of this filter is the same as that of the boundary acoustic wave filter 101 shown in FIG. 16A. Accordingly, reference numerals of individual components of the boundary acoustic wave filter 11 are the same as those of the boundary acoustic wave filter 101 described with reference to FIGS. 16A and 16B. The description of the boundary acoustic wave filter 101 shown in FIGS. 15A and 15B is used to assist the description of the components having the same reference numerals, and the description thereof is omitted.

However, the electrodes were formed by laminating an Au film having a thickness of about 0.05λ on a NiCr film. Thus, the thickness of the Au film was changed to about 0.05λ so that the sound velocity in the boundary acoustic wave filter was decreased.

Figure 9:
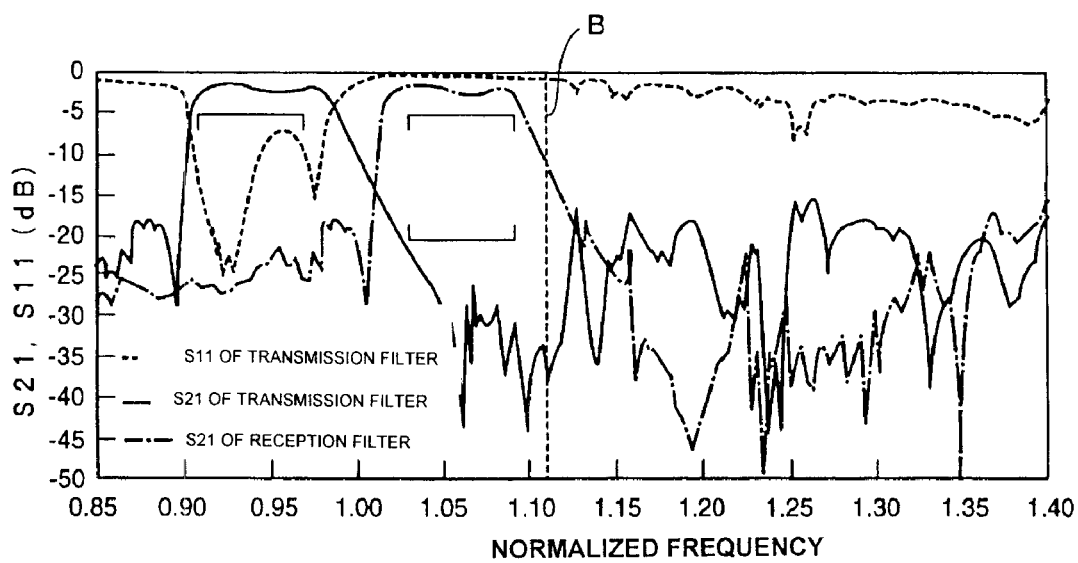
FIG. 9 is a graph showing frequency characteristics of the boundary acoustic wave filter according to a preferred embodiment of the present invention.

A transmission filter and a reception filter were prepared using the boundary acoustic wave filter 11 as in the experimental example described with reference to FIGS. 16A and 16B. FIG. 9 shows the S21 characteristic (transmission characteristic) and the S11 characteristic (reflection characteristic) of the transmission filter and the reception filter.

In FIG. 9, the sound velocity of slow transverse waves propagating through the $SiO_2$ film of the transmission filter is divided by a wavelength λ determined by the period of the IDT electrodes, and the value is represented as a normalized frequency, which is shown by line B. In this preferred embodiment, in the transmission filter, the sound velocity of boundary acoustic waves, which is the product of the wavelength λ and the frequency at least the lower end of the stopband disposed at the high-frequency side of the passband, has a frequency less than that shown by line B, which shows the position of the frequency corresponding to the slow transverse waves propagating through the $SiO_2$ film 109, that is, has a lower value in terms of the dimension of sound velocity. Therefore, the attenuation in the stopband disposed at the high-frequency side of the passband is not degraded, and the attenuation in the stopband disposed at the high-frequency side of the passband is improved to about 23 dB. That is, an attenuation exceeding 20 dB, which is a target attenuation at the stopband, can be ensured. The reason for this will be explained next. In the boundary acoustic wave filter of this preferred embodiment, the sound velocity of the boundary acoustic waves is less than the sound velocity of the slow transverse waves propagating through the $SiO_2$ film 109 defining the second medium layer. Thereby, the boundary waves propagate their energy in the vicinity of the boundary.

As in the characteristic shown in FIG. 9, sufficient attenuation is preferably ensured from the lower end to the higher end of the stopband disposed at the high-frequency side of the filter in which the passband lies in a relatively low frequency range. For this purpose, according to preferred embodiments of the present invention, when the product of the frequency at least the lower end of the stopband disposed at the high-frequency side of the passband and the wavelength λ determined by the period of the electrodes is less than the sound velocity of slow transverse waves, sufficient attenuation is ensured at least the lower end of the stopband. However, as described above, sufficient attenuation is preferably ensured over the entire range of the stopband. Accordingly, more preferably, the product of the frequency at the higher end of the stop band and the wavelength determined by the period of the electrodes is less than the sound velocity of slow transverse waves propagating through the first medium layer and the second medium layer.

Accordingly, for example, in a duplexer or a communication device which includes a transmission filter and a reception filter and in which the passbands of both filters are different from each other, preferably, the boundary acoustic wave filter of the above-described preferred embodiment is used as a filter in which the frequency is relatively low. In this case, at the frequency side higher than the passband of the filter, the product of the frequency at the higher end of the passband of a counterpart filter in which the passband is relatively high and the wavelength determined by the period of the electrodes of the boundary acoustic wave filter is preferably less than the sound velocity of slow transverse waves. In such a case, in the frequency characteristic of the boundary acoustic wave filter, a sufficient attenuation is ensured over the entire range of the passband of the counterpart filter in which the passband is relatively high.

As described above, it is important that a sufficient attenuation is ensured in the stopband disposed at the high-frequency side of the passband of the boundary acoustic wave filter. In this case, in preferred embodiments of the present invention, at least the lower end of the stopband, the product of the frequency at the lower end and the wavelength determined by the period of the electrodes is less than the sound velocity of slow transverse waves. More preferably, as described above, the product of the frequency at the higher end of the stopband disposed at the high-frequency side of the adjacent passband and the wavelength determined by the period of the electrodes or, in a duplexer, the product of the frequency at the higher end of the passband of the counterpart filter and the wavelength determined by the period of the electrodes is less than the sound velocity of slow transverse waves.

As described above, in this preferred embodiment, the product of λ and the frequency at the lower end of the stopband disposed at the high-frequency side is about 3,481 m/sec. In this preferred embodiment, the thickness of the electrodes, i.e., the thickness of the Au film is increased so that the product is less than the sound velocity of slow transverse waves, i.e., about 3,757 m/sec. That is, the sound velocity is decreased by increasing the film thickness of the electrodes composed of Au. Thus, the product of the wavelength λ determined by the period of the electrodes and the frequency at the lower end of the stopband disposed at the high-frequency side of the passband is less than the sound velocity of slow transverse waves propagating through the $SiO_2$ film 109.

In the above-described preferred embodiment, the thickness of the electrode film is increased such that the product of the frequency at least the lower end of the stopband disposed at the high-frequency side of the passband and the wavelength determined by the period of the electrodes is less than the sound velocity of slow transverse waves. However, the product of the frequency at least the lower end of the stopband disposed at the high-frequency side of the passband and the wavelength determined by the period of the electrodes may be controlled to be less than the sound velocity of slow transverse waves by alternative methods. That is, in a boundary acoustic wave filter, the frequency bands of the passband and the stopband disposed at the high-frequency side and the attenuations differ depending on the required specifications. Accordingly, the wavelength λ determined by the period of the electrodes, the sound velocity determined by the thickness or the density of the electrodes, the sound velocity of slow transverse waves propagating through a medium layer, the sound velocity of slow transverse waves being determined by, for example, the structure of the medium layer, may be appropriately adjusted so as to satisfy the required specifications. Thereby, as described above, the product of the wavelength λ determined by the period of the electrodes and the frequency at the lower end of the stopband disposed at the high-frequency side of the passband may be controlled to be less than the sound velocity of slow transverse waves.

Figure 10:
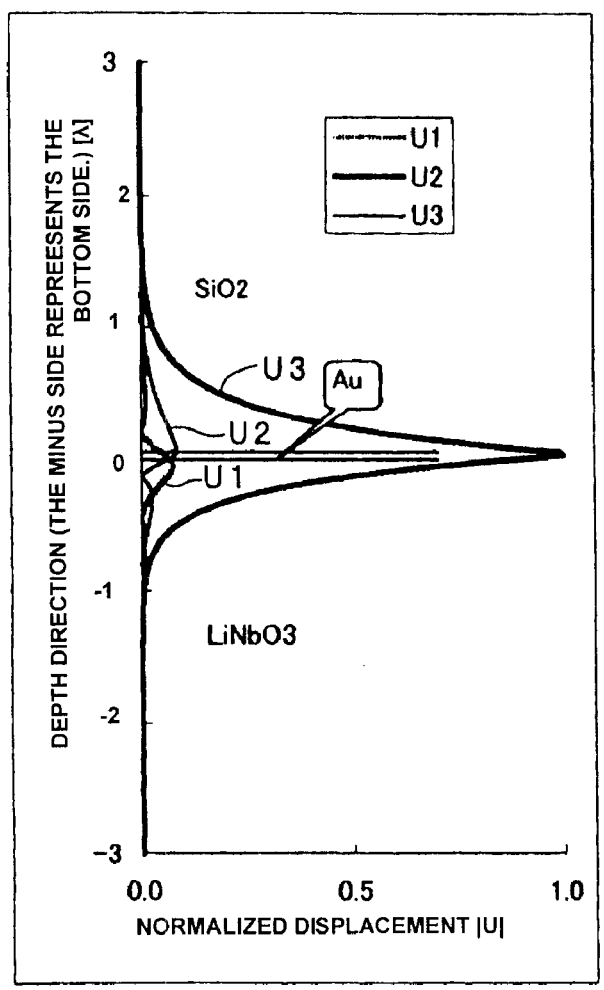
FIG. 10 is a graph showing distributions of individual components of boundary acoustic waves.

The reason that, as described above, the sound velocity of boundary waves can be controlled to be less than the sound velocity of slow transverse waves by increasing the film thickness of the electrodes is as follows. FIG. 10 is a graph showing calculated values of displacement components U1, U2, and U3 in an SH-type boundary acoustic wave resonator. As shown in FIG. 10, the displacement is concentrated near Au, which defines a boundary layer, and is distributed so as to expand to $LiNbO_3$ and $SiO_2$. Therefore, when the film thickness of the electrodes is small, boundary waves are affected by $SiO_2$ and $LiNbO_3$, for which waves propagating therethrough have a high sound velocity. Consequently, the sound velocity of SH-type boundary waves cannot be controlled to be less than the sound velocity of slow transverse waves propagating through $SiO_2$. In contrast, when the film thickness of the electrodes is increased, the sound velocity of the SH-type boundary waves can be controlled to be less than the sound velocity of slow transverse waves propagating through $SiO_2$.

Figure 11:
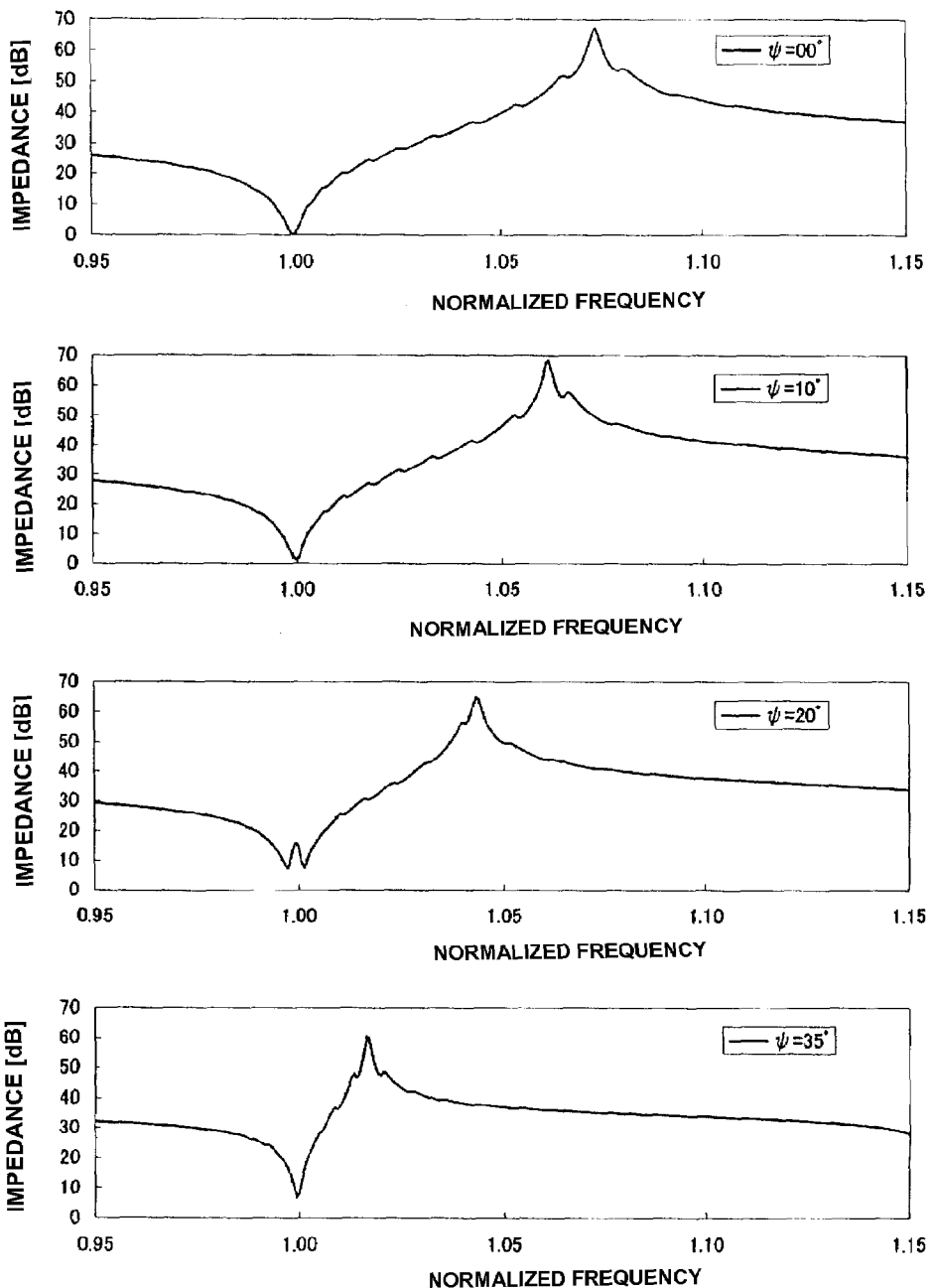
FIG. 11 includes graphs showing the relationship between the density $\rho$ of an electrode material and an electrode film thickness H at which the propagation loss of boundary acoustic waves is zero.

FIG. 11 includes graphs showing the relationship between the density ρ of an electrode material and an electrode film thickness H at which the propagation loss of SH-type boundary waves is zero. As shown in FIG. 11, when the following expression (2) is satisfied, SH-type boundary waves having a propagation loss α of zero are obtained. When the film thickness of the electrodes is increased so as to satisfy expression (2), as described above, the sound velocity of the boundary waves can be less than the sound velocity of slow transverse waves propagating through $SiO_2$.

$$H(\lambda) > 8261.744\rho^{-1.376} \quad (2)$$

In various preferred embodiments of the present invention, the electrodes may be composed of a metal other than Au. The electrodes may be composed of Ag, Cu, Fe, Ta, W, Ti, Pt or another suitable metal. In order to increase the adhesiveness and electric power resistance, a thin metal layer composed of Ti, Cr, NiCr, or other suitable metal may be laminated on a main electrode layer. Furthermore, the thin metal layer may be disposed between the first medium layer and the main electrode layer, between the second medium layer and the main electrode layer, or as an interlayer of electrodes composed of a plurality of electrode layers. In preferred embodiments of the present invention, the electrodes may be formed using an alloy composed of a plurality of metals.

As described above, the electrodes may be composed of various types of material, and it is sufficient that the total thickness of each electrode satisfies expression (2). Thereby, the sound velocity of boundary acoustic waves can be controlled to be less than the sound velocity of slow transverse waves.

In the above-described preferred embodiment, the sound velocity of boundary acoustic waves is controlled to be less than the sound velocity of slow transverse waves by increasing the film thickness of the electrodes. Alternatively, as described above, the sound velocity of boundary acoustic waves can be controlled to be less than the sound velocity of slow transverse waves by a method of adjusting the density of the electrodes or a method of adjusting the duty ratio.

Furthermore, in the boundary acoustic wave device according to preferred embodiments of the present invention, a protective layer may be formed on the outside in the laminating direction of a laminated structure composed of dielectric substance/electrode/piezoelectric substance in order to increase the strength of the boundary acoustic wave device or to prevent a corrosive gas or other contaminant from intruding. The boundary acoustic wave device according to preferred embodiments of the present invention may be included in a package.

The protective layer may be composed of an insulating material such as titanium oxide, aluminum nitride, or aluminum oxide; a film of a metal such as Au, Al, or W; or a resin such as a urethane, an epoxy, or a silicone resin.

In various preferred embodiments of the present invention, the piezoelectric substance may be a piezoelectric film deposited on a dielectric substance.

Figure 12:
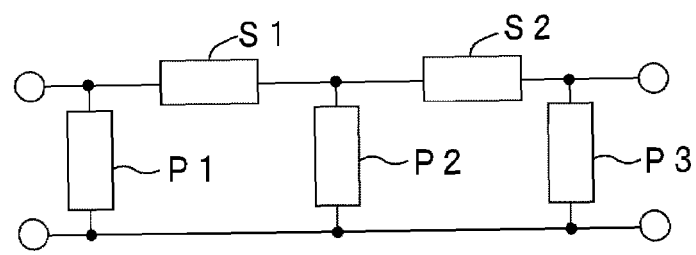
FIG. 12 is a diagram showing a ladder-type circuit, which is an example of the structure of a boundary acoustic wave filter circuit according to a preferred embodiment of the present invention.

The boundary acoustic wave filter according to the present invention is not limited to the above-described longitudinally coupled filter with a 3-IDT structure. Specifically, the boundary acoustic wave filter may be a longitudinally coupled filter having two or more IDT electrodes or, as shown in FIG. 12, a ladder-type filter in which a plurality of series-arm resonators S1 and S2 and a plurality of parallel-arm resonators P1 to P3 that are composed of 1-port resonators are connected so as to have a ladder-type circuit configuration. Alternatively, the boundary acoustic wave filter according to the present invention may be a transversely coupled filter.

In addition, the electrodes defining an electroacoustic transducer are not limited to IDT electrodes. A comb-shaped transducer described in "Dansei Hyoumenha Kougaku (surface acoustic wave engineering)" issued by The Institute of Electronics, Information and Communication Engineers, the sixth edition, p. 57 may also be used. In such a case, λ is determined by the arrangement period of teeth of the comb-shaped transducer. That is, the wavelength at which the electroacoustic transducer is excited is defined as λ.

Figure 13:
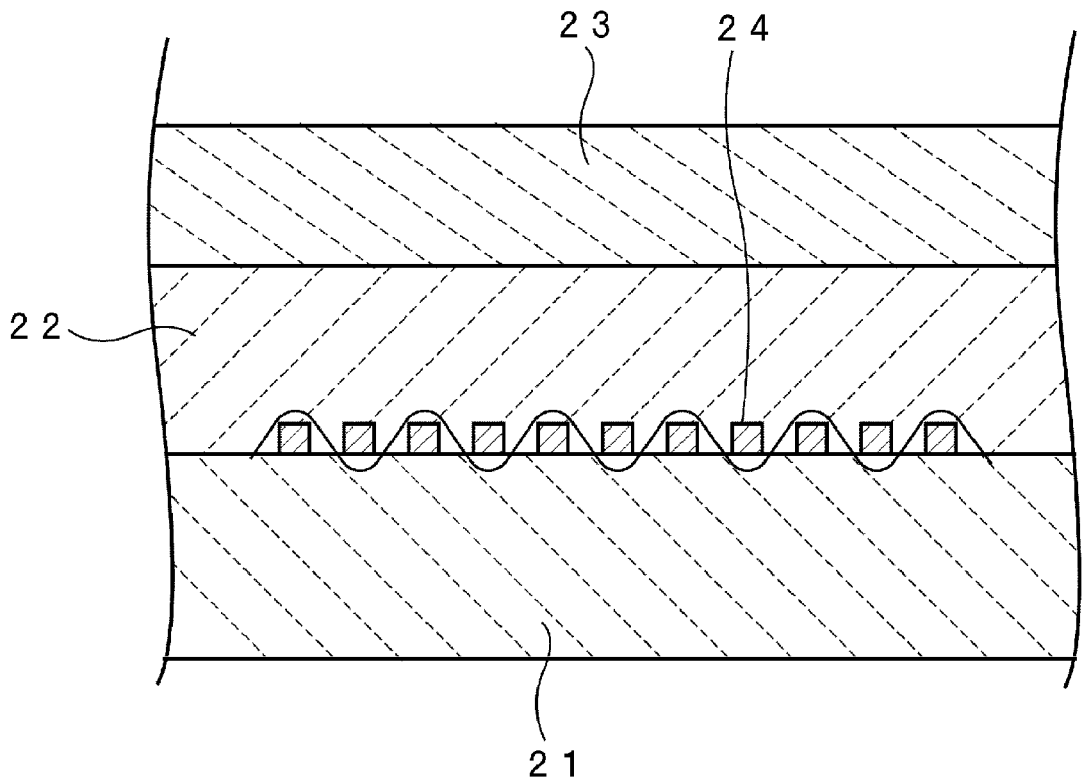
FIG. 13 is a partial cutaway front cross-sectional view showing a boundary acoustic wave filter including a sound-absorption medium layer, which is a modification of the boundary acoustic wave filter according to a preferred embodiment of the present invention.

In the boundary acoustic wave filter according to preferred embodiments of the present invention, as shown in FIG. 13, a sound-absorption medium layer 23 may be formed so as to be in contact with a second medium layer 22, thereby suppressing the higher-order spurious mode or suppressing the degradation due to leaky bulk waves. In the boundary acoustic wave filter shown in FIG. 13, a structure in which an electrode 24 is disposed between a first medium layer 21 and the second medium layer 22 is schematically shown.

In this case, the sound-absorption medium layer may be provided on the outer surface of the first medium layer 21. Alternatively, sound-absorption medium layers may be provided on an outer surface of both the first medium layer 21 and the second medium layer 22.

Figure 14:
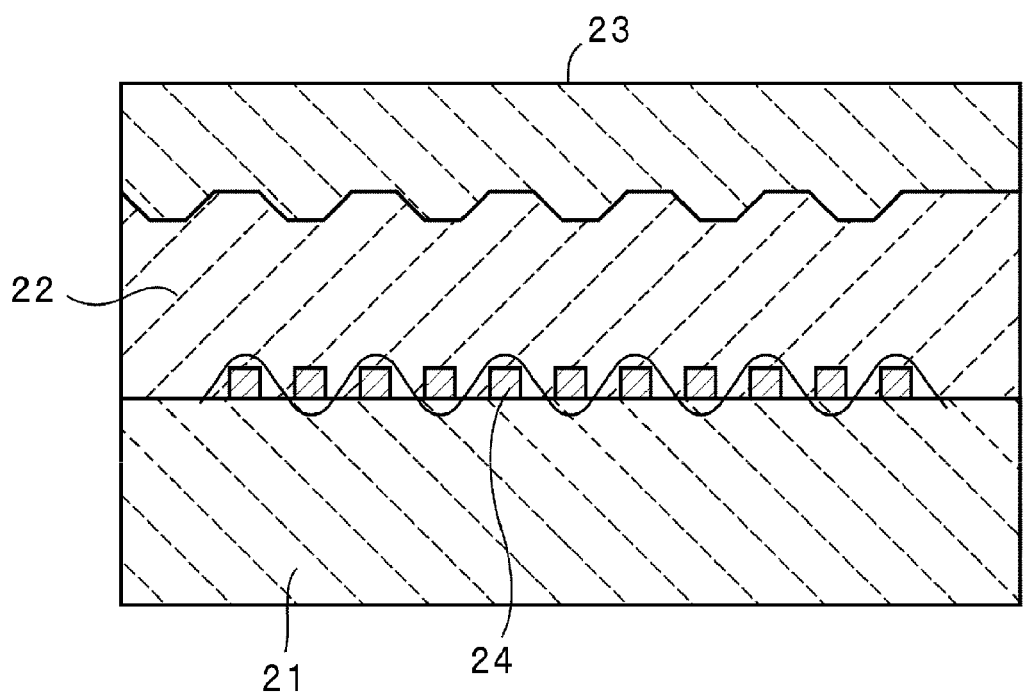
FIG. 14 is a front cross-sectional view showing another modification of the boundary acoustic wave filter according to a preferred embodiment of the present invention, that is, a front cross-sectional view showing a boundary acoustic wave filter in which irregularities are provided outside a first medium layer.

Furthermore, as shown in FIG. 14, irregularities may be formed on the surface of the second medium layer 22. The formation of the irregularities suppresses the degradation due to leaky bulk waves. The irregularities may be provided on the outer surface of the second medium layer 22. Alternatively, the irregularities may be provided on an outer surface of both the first medium layer 21 and the second medium layer 22.

In the boundary acoustic wave filter according to preferred embodiments of the present invention, the materials defining the first medium layer and the second medium layer are not limited to $LiNbO_3$ and $SiO_2$. Examples of the material that can be used include various piezoelectric substances such as potassium niobate, lithium tantalate, lithium tetraborate, langasite, langanite, quartz crystal, lead zirconate titanate ceramics, ZnO, and AlN; and various dielectric substances such as glass, silicon, sapphire, silicon nitride, and carbon nitride.

Each of the first medium layer and the second medium layer need not be composed of a single material and may have a structure prepared by laminating a plurality of material layers. In such a case, the sound velocity of waves in any one of the material layers in which the energy of leaky bulk waves or a higher-order spurious mode of the boundary acoustic wave is distributed is controlled so as to satisfy expression (1). For example, when Au is used for the electrodes, the energy of boundary acoustic waves is substantially concentrated in a range of about 1λ from both of the upper side and the lower side of the boundary layer. On the other hand, when an electrode material whose density is not as high as that of Au is used, the confinement effect is decreased, and the energy may be distributed in a range of about 10λ from the boundary layer. Accordingly, in order to suppress the higher-order spurious mode having a low response strength, attention should be provided to the sound velocity at a medium layer portion disposed in the range of about 10λ from the boundary layer.

In the present invention, a protective layer for increasing the strength of the device or preventing a corrosive gas from intruding may be formed on the outside of the first medium layer and the second medium layer. As required, the laminated structure having the first medium layer and the second medium layer may be included in a package. The material used for forming the protective layer is not particularly limited. The protective layer may be composed of an insulating material such as titanium oxide, aluminum oxide, or aluminum nitride; or a metal such as Au, Al, or W.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave filter comprising:
   a first medium layer;
   a second medium layer laminated on the first medium layer; and
   electrodes disposed at a boundary between the first medium layer and the second medium layer and defining an electroacoustic transducer; wherein
   the product of the wavelength λ determined by a period of the electrodes and a frequency at least a lower end of the stopband disposed at a high-frequency side of the passband is less than a sound velocity of slow transverse waves propagating through at least one of the first medium layer and the second medium layer.

2. The boundary acoustic wave filter according to claim 1, wherein at least one of the first medium layer and the second medium layer is isotropic, and when the sound velocity of slow transverse waves propagating through at least one of the first medium layer and the second medium layer is represented by Vs, the elastic stiffness constants of the first medium layer and the second medium layer are represented by C11 and C12, respectively, and the density is represented by ρ, the sound velocity Vs satisfies expression (1):

$$V_S = \sqrt{\frac{C_{11} - C_{12}}{2\rho}}. \tag{1}$$

3. The boundary acoustic wave filter according to claim 1, wherein a sound-absorption medium layer is provided on an outer surface of at least one of the first medium layer and the second medium layer.

4. The boundary acoustic wave filter according to claim 3, wherein the sound-absorption medium layer is provided on the outer surface of both of the first medium layer and the second medium layer.

5. The boundary acoustic wave filter according to claim 1, wherein irregularities are provided on an outer surface of at least one of the first medium layer and the second medium layer.

6. The boundary acoustic wave filter according to claim 5, wherein the irregularities are provided on the outer surface of both of the first medium layer and the second medium layer.

7. The boundary acoustic wave filter according to claim 1, wherein the electrodes include at least one metal selected from the group consisting of Au, Ag, Cu, Fe, Ta, W, Ti, and Pt.

8. The boundary acoustic wave filter according to claim 1, wherein each of the first and second medium layers includes one substance selected from the group consisting of lithium niobate, potassium niobate, lithium tantalate, lithium tetraborate, langasite, langanite, quartz crystal, PZT, ZnO, AlN, silicon oxides, glass, silicon, sapphire, silicon nitride, and carbon nitride.

9. The boundary acoustic wave filter according to claim 1, wherein at least one of the first medium layer and the second medium layer has a laminated structure in which a plurality of material layers are laminated.

10. The boundary acoustic wave filter according to claim 1, wherein the boundary acoustic wave filter is used as a boundary acoustic wave filter used in a communication device including a transmission filter and a reception filter, the boundary acoustic wave filter has a relatively low frequency.

11. The boundary acoustic wave filter according to claim 10, wherein, in the filter in which the center frequency is relatively low, the product of the wavelength λ determined by the period of the electrodes and, in the stopband at the high-frequency side of the passband of the filter in which the center frequency is relatively low, the frequency at the higher end of the passband of another filter in which the center frequency is relatively high is less than the sound velocity of the slow transverse waves.

12. The boundary acoustic wave filter according to claim 1, wherein the boundary acoustic wave filter is used as a transmission filter or a reception filter of a duplexer including the transmission filter and the reception filter, the boundary acoustic wave filter has a relatively low frequency.

13. The boundary acoustic wave filter according to claim 12, wherein, in the filter in which the center frequency is relatively low, the product of the wavelength λ determined by the period of the electrodes and, in the stopband at the high-frequency side of the passband of the filter in which the center frequency is relatively low, the frequency at the higher end of the passband of another filter in which the center frequency is relatively high is less than the sound velocity of the slow transverse waves.

* * * * *